(12) United States Patent
Miyake

(10) Patent No.: US 10,121,905 B2
(45) Date of Patent: Nov. 6, 2018

(54) SEMICONDUCTOR DEVICE

(71) Applicant: Semiconductor Energy Laboratory Co., Ltd., Kanagawa-ken (JP)

(72) Inventor: Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 244 days.

(21) Appl. No.: 14/474,800

(22) Filed: Sep. 2, 2014

(65) Prior Publication Data
US 2015/0060847 A1 Mar. 5, 2015

(30) Foreign Application Priority Data

Sep. 20, 2013 (JP) .................................. 2013-183030

(51) Int. Cl.
*H01L 29/788* (2006.01)
*H01L 29/786* (2006.01)
(Continued)

(52) U.S. Cl.
CPC ...... *H01L 29/788* (2013.01); *H01L 29/78648* (2013.01); *G09G 3/3233* (2013.01);
(Continued)

(58) Field of Classification Search
CPC ..... G09G 2320/0252; G09G 2330/021; G09G 3/342; G09G 2310/024; G09G 2310/027; G09G 3/3688
(Continued)

(56) References Cited

U.S. PATENT DOCUMENTS 5,448,198 A 9/1995 Toyoshima et al.
5,461,338 A 10/1995 Hirayama et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Mary Wilczewski
*Assistant Examiner* — Tsz Chiu
(74) *Attorney, Agent, or Firm* — Husch Blackwell LLP

(57) ABSTRACT

Provided is a semiconductor device including a transistor in which a first gate and a second gate are provided with a channel formation region provided therebetween and which achieves both control of the threshold voltage and an increase in the on-state current. In a period during which first voltage with which the transistor is turned off is supplied to the first gate, control voltage for controlling the threshold voltage is supplied to the second gate. In a period during which second voltage with which the transistor is turned on is supplied to the first gate, the second voltage is supplied to the first gate and voltage in which voltage based on change in the voltage of a signal supplied to the first gate is added to the control voltage is supplied to the second gate.

12 Claims, 11 Drawing Sheets

(51) Int. Cl.
    *G09G 3/3233*     (2016.01)
    *H01L 27/12*     (2006.01)

(52) U.S. Cl.
    CPC ............... *G09G 2300/0861* (2013.01); *G09G 2300/0866* (2013.01); *H01L 27/1255* (2013.01); *H01L 29/7869* (2013.01)

(58) Field of Classification Search
    USPC ............................ 345/82, 87, 76; 315/169.3
    See application file for complete search history.

(56) References Cited

U.S. PATENT DOCUMENTS

| | | | |
|---|---|---|---|
| 5,610,533 A | 3/1997 | Arimoto et al. | |
| 5,731,856 A | 3/1998 | Kim et al. | |
| 5,744,864 A | 4/1998 | Cillessen et al. | |
| 5,818,070 A | 10/1998 | Yamazaki et al. | |
| 6,049,110 A | 4/2000 | Koh | |
| 6,060,918 A | 5/2000 | Tsuchida et al. | |
| 6,097,113 A | 8/2000 | Teraoka et al. | |
| 6,150,869 A | 11/2000 | Storino et al. | |
| 6,239,649 B1 | 5/2001 | Bertin et al. | |
| 6,294,274 B1 | 9/2001 | Kawazoe et al. | |
| 6,306,691 B1 | 10/2001 | Koh | |
| 6,333,571 B1 | 12/2001 | Teraoka et al. | |
| 6,342,717 B1 | 1/2002 | Komatsu | |
| 6,351,176 B1 | 2/2002 | Houston | |
| 6,462,723 B1 | 10/2002 | Yamazaki et al. | |
| 6,518,825 B2 | 2/2003 | Miyazaki et al. | |
| 6,563,174 B2 | 5/2003 | Kawasaki et al. | |
| 6,727,522 B1 | 4/2004 | Kawasaki et al. | |
| 6,778,002 B2 | 8/2004 | Miyazaki et al. | |
| 6,833,750 B2 | 12/2004 | Miyazaki et al. | |
| 6,989,706 B2 | 1/2006 | Sekigawa et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,161,408 B2 | 1/2007 | Mizuno et al. | |
| 7,205,825 B2 | 4/2007 | Klein et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,307,317 B2 | 12/2007 | Koyama | |
| 7,323,356 B2 | 1/2008 | Hosono et al. | |
| 7,348,827 B2 | 3/2008 | Rahim et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,580,310 B2 | 8/2009 | Chu | |
| 7,592,832 B2 | 9/2009 | Perisetty | |
| 7,646,367 B2 * | 1/2010 | Kimura | G09G 3/2014 315/169.3 |
| 7,674,650 B2 | 3/2010 | Akimoto et al. | |
| 7,732,819 B2 | 6/2010 | Akimoto et al. | |
| 7,732,864 B2 | 6/2010 | Kawahara et al. | |
| 7,808,045 B2 | 10/2010 | Kawahara et al. | |
| 7,943,996 B2 | 5/2011 | Kawahara et al. | |
| 8,067,775 B2 | 11/2011 | Miyairi et al. | |
| 8,106,400 B2 | 1/2012 | Miyairi et al. | |
| 8,278,162 B2 | 10/2012 | Akimoto et al. | |
| 8,344,788 B2 | 1/2013 | Yamazaki et al. | |
| 8,508,283 B2 | 8/2013 | Kawahara et al. | |
| 8,664,658 B2 | 3/2014 | Yoneda | |
| 8,710,762 B2 | 4/2014 | Takahashi et al. | |
| 8,744,038 B2 | 6/2014 | Hirose | |
| 8,823,439 B2 | 9/2014 | Yamazaki et al. | |
| 8,847,665 B2 | 9/2014 | Araki et al. | |
| 8,871,565 B2 | 10/2014 | Yamazaki et al. | |
| 9,012,918 B2 | 4/2015 | Yamazaki et al. | |
| 9,024,317 B2 | 5/2015 | Endo et al. | |
| 9,105,668 B2 | 8/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0174349 A1* | 9/2004 | Libsch | G09G 3/3233 345/204 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0244029 A1 | 9/2010 | Yamazaki et al. | |
| 2011/0057918 A1 | 3/2011 | Kimura et al. | |

(56) References Cited

U.S. PATENT DOCUMENTS

| | | |
|---|---|---|
| 2011/0102409 A1 | 5/2011 | Hayakawa |
| 2012/0061663 A1 | 3/2012 | Yamazaki et al. |
| 2012/0061668 A1 | 3/2012 | Miyairi et al. |
| 2012/0064664 A1 | 3/2012 | Yamazaki et al. |
| 2012/0104386 A1 | 5/2012 | Miyairi et al. |
| 2013/0034199 A1 | 2/2013 | Toyotaka |
| 2013/0069068 A1 | 3/2013 | Miyake |
| 2013/0300462 A1 | 11/2013 | Koyama et al. |
| 2014/0320107 A1 | 10/2014 | Takahashi et al. |
| 2015/0214379 A1 | 7/2015 | Yamazaki et al. |
| 2016/0248419 A1 | 8/2016 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-252470 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-296795 A | 10/2004 |
| JP | 2008-028916 A | 2/2008 |
| JP | 2010-283338 A | 12/2010 |
| JP | 2011-172217 A | 9/2011 |
| JP | 2011-211213 A | 10/2011 |
| JP | 2011-258941 A | 12/2011 |
| JP | 2013-084761 A | 5/2013 |
| WO | WO-2004/114391 | 12/2004 |
| WO | WO 2010/125986 A1 | 11/2010 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The"Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Gn—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digeest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2FeO7 Types of Structures for Compounds in the In2O3 and Sc2O3—A2O3—Bo Systems [A; Fe, Ga, or Al; B: Mg, Mn, Fe, Ni, Cu,or Zn]at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physical Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layers", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2009, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

20

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a memory device, a driving method thereof, or a manufacturing method thereof. Specifically, one embodiment of the present invention relates to a semiconductor device, particularly a semiconductor device including an oxide semiconductor.

2. Description of the Related Art

In a transistor in which an oxide semiconductor (OS) is used for a semiconductor layer where a channel is formed (such a transistor is also referred to as an OS transistor), the threshold voltage of the transistor can be controlled by supplying appropriate voltage to a back gate (see, for example, Patent Document 1).

A back gate is an electrode which is a counterpart to a front gate. The back gate and the front gate are provided with a semiconductor layer including a channel formation region provided therebetween. For example, in a bottom-gate transistor, a gate under a channel formation region is a front gate and a gate over the channel formation region is a back gate. Note that a front gate and a back gate are called a first gate and a second gate, respectively, in some cases.

In an OS transistor with a so-called dual gate structure in which a back gate is connected to a front gate, the current value in a conduction state can be efficiently increased even when the OS transistor has smaller size (see, for example, Patent Document 2). For example, a dual-gate transistor is used in a gate driver of a display device, whereby the display device can have a narrow frame.

REFERENCE

Patent Document

[Patent Document 1] Japanese Published Patent Application No. 2011-172217
[Patent Document 2] Japanese Published Patent Application No. 2011-258941

SUMMARY OF THE INVENTION

However, it is difficult to achieve both control of the threshold voltage and an increase in the current value described above at the same time because the same back gate is used and connection needs to be switched.

In view of the above, an object of one embodiment of the preset invention is to provide a semiconductor device with a novel structure, which includes a transistor which can achieve both control of the threshold voltage and an increase in the current value. Another object of one embodiment of the present invention is to provide a semiconductor device with a novel structure, in which reliability of a transistor can be increased. Another object of one embodiment of the present invention is to provide a semiconductor device with a novel structure.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including a transistor including a first gate and a second gate with a channel formation region provided therebetween. In the transistor, in a period during which first voltage with which the transistor is turned off is supplied to the first gate, control voltage for controlling the threshold voltage is supplied to the second gate, and in a period during which second voltage with which the transistor is turned on is supplied to the first gate, the second voltage is supplied to the first gate and voltage in which voltage based on change in the voltage of the first gate is added to the control voltage is supplied to the second gate.

One embodiment of the present invention is a semiconductor device including a transistor including a first gate and a second gate with a channel formation region provided therebetween. The second gate is electrically connected to the first gate through a capacitor. In the transistor, in a period during which first voltage with which the transistor is turned off is supplied to the first gate, control voltage for controlling the threshold voltage is supplied to the second gate, and in a period during which second voltage with which the transistor is turned on is supplied to the first gate, voltage which makes the second gate electrically floating and in which voltage based on change in the voltage of the first gate is added to the control voltage is supplied to the second gate.

In the semiconductor device of one embodiment of the present invention, the control voltage is preferably supplied through a switch electrically connected to the second gate.

In the semiconductor device of one embodiment of the present invention, the switch is preferably a transistor.

One embodiment of the present invention is a semiconductor device including a transistor including a first gate and a second gate with a channel formation region provided therebetween. Voltage of an output terminal of a source follower whose input terminal is electrically connected to the first gate is supplied to the second gate. In the transistor, in a period during which first voltage with which the transistor is turned off is supplied to the first gate, control voltage for controlling the threshold voltage is supplied to the second gate, and in a period during which second voltage with which the transistor is turned on is supplied to the first gate, voltage which makes the second gate electrically floating and in which voltage based on change in the voltage of the first gate is added to the control voltage is supplied to the second gate.

In the semiconductor device of one embodiment of the present invention, an oxide semiconductor is preferably used for a semiconductor layer serving as a channel formation region in the transistor.

Note that other embodiments of the present invention will be described in the following embodiments with reference to the drawings.

According to one embodiment of the present invention, a semiconductor device with a novel structure, which includes a transistor which can achieve both control of the threshold voltage and an increase in the current value and has excellent reliability and electric characteristic can be provided. Note that one embodiment of the present invention is not limited to the above effect. For example, depending on circumstances or conditions, one embodiment of the present invention might produce another effect. Furthermore, depending on circumstances or conditions, one embodiment of the present invention might not produce the above effect.

DETAILED DESCRIPTION OF THE INVENTION

Figure 1A:
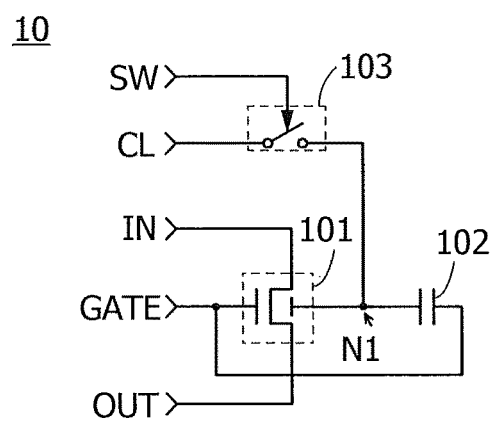
FIGS. 1A and 1B are views for describing a circuit and operation of one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as "first", "second", and "third" are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for describing arrangement, such as "over" and "under", are used for convenience for describing the positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, the layout of circuit blocks in a drawing specifies the positional relation for description. Thus, even when a drawing shows that different functions are achieved in different circuit blocks, an actual circuit block may be configured so that the different functions are achieved in the same circuit or region. Further, the function of each circuit block in a drawing is specified for description. Thus, even when one circuit block is illustrated, an actual circuit or region may be configured so that processing which is illustrated as being performed in the one circuit block is performed in a plurality of circuit blocks.

In this specification and the like, voltage refers to a difference between a given potential and a reference potential (e.g., a ground potential) in many cases. Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

Note that in general, a potential and voltage are relative values. Therefore, a ground potential is not always 0 V.

In this specification and the like, the term "parallel" indicates that the angle between two straight lines ranges from −10° to 10°, and accordingly also includes the case where the angle ranges from −5° to 5°. In addition, the term "perpendicular" indicates that the angle between two straight lines ranges from 80° to 100°, and accordingly includes the case where the angle ranges from 85° to 95°.

In this specification and the like, the trigonal and rhombohedral crystal systems are included in the hexagonal crystal system.

Embodiment 1

In this embodiment, a circuit structure and operation of a semiconductor device will be described.

Note that a semiconductor device refers to a device including a semiconductor element. The semiconductor device includes a driver circuit or the like for driving a circuit including a semiconductor element. Note that a module includes not only a semiconductor device but also a driver circuit, a power supply circuit, or the like provided over a substrate different from a substrate provided with the semiconductor device in some cases.

FIG. 1A is a circuit diagram illustrating an example of a semiconductor device 10.

The semiconductor device 10 illustrated in FIG. 1A includes a transistor 101, a capacitor 102, and a switch 103.

The transistor 101 can be used as a transistor which is part of a circuit such as a driver circuit.

The transistor 101 includes a front gate and a back gate with a channel formation region provided therebetween. In the transistor 101, voltage with which the transistor 101 is brought into a conduction state is supplied to the front gate and the back gate in a conduction state, and voltage with which the transistor 101 is brought into a non-conduction state is supplied to the front gate and control voltage (also referred to as voltage VC) for controlling the threshold voltage is supplied to the back gate in a non-conduction state.

The voltage VC is voltage with which the threshold voltage of the transistor 101 is shifted in the positive direction so that the transistor becomes an enhancement transistor, i.e., a normally-off transistor. The voltage VC is supplied to a node N1 through the switch 103 to be held.

As illustrated in FIG. 1A, the node N1 is a node which is connected to the back gate of the transistor 101, the capacitor 102, and the switch 103.

The front gate of the transistor 101 is connected to a wiring for supplying a control signal GATE. The back gate of the transistor 101 is connected to the node N1. One of a source and a drain of the transistor 101 is connected to a wiring for supplying an input signal IN. The other of the source and the drain of the transistor 101 is connected to a wiring for supplying an output signal OUT.

The front gate of the transistor 101 is referred to as a first gate in some cases. The back gate of the transistor 101 is referred to as a second gate in some cases.

The control signal GATE is a signal for controlling a conduction state and a non-conduction state of the transistor 101 by alternately changing voltage between an H level and an L level. For example, in the case where the transistor 101 is an n-channel transistor, the L-level voltage of the control signal GATE is the voltage (first voltage) with which the transistor 101 is turned off, and the H-level voltage of the control signal GATE is the voltage (second voltage) with which the transistor 101 is turned on.

The H-level voltage is, for example, a high power supply potential VDD, and the L-level voltage is, for example, a low power supply potential VSS.

The first voltage with which the transistor 101 is turned off is the voltage which is supplied so that the voltage between the gate (first gate) and the source is lower than the threshold voltage. In this specification, a period during which the L-level voltage of the control signal GATE is supplied is a period during which the first voltage with which the transistor 101 is turned off is supplied.

The second voltage with which the transistor 101 is turned on is the voltage which is supplied so that the voltage between the gate (first gate) and the source is higher than the threshold voltage. In this specification, a period during which the H-level voltage of the control signal GATE is supplied is a period during which the second voltage with which the transistor 101 is turned on is supplied.

The input signal IN is a signal such as a clock signal, a constant potential signal, or a pulsed signal, and is supplied from an element such as a transistor included in a circuit in a previous stage or a wiring supplied with the signal. The output signal OUT is, in the case where the transistor 101 is in a conduction state, a signal obtained by directly outputting the input signal IN. The output signal OUT is supplied to an element such as a transistor included in a circuit in a subsequent stage.

The voltage supplied to the back gate of the transistor 101 can be controlled so as to differ depending on a period by change of the control signal GATE through the capacitor 102 and on and off states of the switch 103. Specifically, the voltage VC is supplied in a period during which the transistor 101 is in a non-conduction state, i.e., in a period during which the first voltage is supplied to the front gate of the transistor 101. The back gate of the transistor 101 is supplied with voltage in which voltage based on change in the voltage of the front gate is added to the voltage VC in a period during which the transistor 101 is in a conduction state, i.e., in a period during which the second voltage is supplied to the front gate of the transistor 101.

Note that in this embodiment, the transistor 101 is an n-channel transistor. In the case where the transistor 101 is a p-channel transistor, signals supplied to wirings may be inverted.

For example, any of amorphous silicon, microcrystalline silicon, polycrystalline silicon, single-crystal silicon, amorphous germanium, microcrystalline germanium, polycrystalline germanium, and single-crystal germanium can be used for the semiconductor layer of the transistor 101, although a material of the semiconductor layer is not limited thereto. Alternatively, an oxide semiconductor, a compound semiconductor such as a nitride semiconductor, an organic semiconductor, or the like can be used.

An oxide semiconductor is particularly preferably used for the semiconductor layer of the transistor of this embodiment. The threshold voltage of the transistor including an oxide semiconductor is difficult to control in some cases as compared to a transistor including silicon. The use of a transistor including an oxide semiconductor as the transistor 101 of this embodiment brings great advantages such as control of the threshold voltage and excellent electric characteristics.

The transistor 101 includes the front gate and the back gate, whereby an electric field can be applied to the channel formation region from above and below. Therefore, the number of carriers flowing through the semiconductor layer of the transistor 101 can be increased, leading to an increase in the field-effect mobility and on-state current of the transistor.

Since the transistor 101 includes the front gate and the back gate, the front gate and the back gate can each block an electric field from the outside. Therefore, an effect of charge, such as charged particles around the front gate and the back gate, on the semiconductor layer can be reduced. As a result, degradation in a stress test (e.g., a negative gate bias temperature (−GBT) stress test in which negative potentials are applied to a front gate) can be suppressed, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. As the amount of change in the threshold voltage between before and after the BT stress test is small, the transistor has high reliability.

The capacitor 102 is a capacitor for changing the voltage of the back gate of the transistor 101 into the voltage with which the transistor 101 is turned on or the voltage VC in accordance with change in the voltage of the control signal GATE. In the structure of this embodiment, the voltage VC is supplied to the back gate of the transistor 101 through the switch 103 in advance, and the switch 103 is electrically turned off in this state; thus, the back gate of the transistor 101, which is connected to the node N1, can be brought into a floating state. The capacitor 102 is provided to utilize the change in voltage due to capacitive coupling as a unit for changing the voltage of the back gate of the transistor 101 in a floating state in accordance with the change of the control signal GATE.

The change in the voltage due to capacitive coupling is caused when the voltage of the control signal GATE changes from an L level to an H level and when the voltage of the control signal GATE changes from an H level to an L level. In the case where the voltage of the control signal GATE changes from an L level to an H level, the voltage of the back gate of the transistor 101 changes from the voltage VC to voltage in which voltage based on change in the voltage of the control signal GATE is added to the voltage VC. In the case where the voltage of the control signal GATE changes from an H level to an L level, the voltage of the back gate of the transistor 101 changes from the voltage in which the voltage based on change in the voltage of the control signal GATE is added to the voltage VC, to the voltage VC in which the voltage based on change in the voltage of the control signal GATE is deducted.

One of electrodes of the capacitor 102 is connected to the wiring for supplying the control signal GATE. The other of the electrodes of the capacitor 102 is connected to the back gate of the transistor 101.

The switch 103 is a switch for switching between whether the voltage VC is supplied to the back gate of the transistor 101 and whether the back gate is brought into an electrically floating state, in accordance with a control signal SW. When the switch 103 is turned on, the voltage VC is supplied to the back gate of the transistor 101, and when the switch 103 is turned off, the back gate is brought into an electrically floating state.

One terminal of the switch 103 is connected to a wiring CL for supplying the voltage VC. The other terminal of the switch 103 is connected to the back gate of the transistor 101 and the other electrode of the capacitor 102.

The control signal SW is a signal for controlling on and off states of the switch 103. For example, in the case where the switch 103 is an n-channel transistor, the switch 103 is turned on with an H-level control signal SW while the switch 103 is turned off with an L-level control signal SW.

Figure 2A:
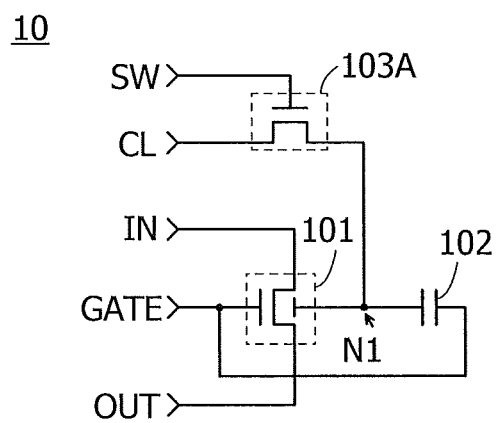
FIGS. 2A and 2B are each a view illustrating a circuit of one embodiment of the present invention.

In the case where the switch 103 is an n-channel transistor, a circuit diagram illustrated in FIG. 2A can be used. As illustrated in FIG. 2A, a transistor 103A may be provided instead of the switch 103, and the control signal SW may be supplied to a gate of the transistor 103A.

Figure 2B:
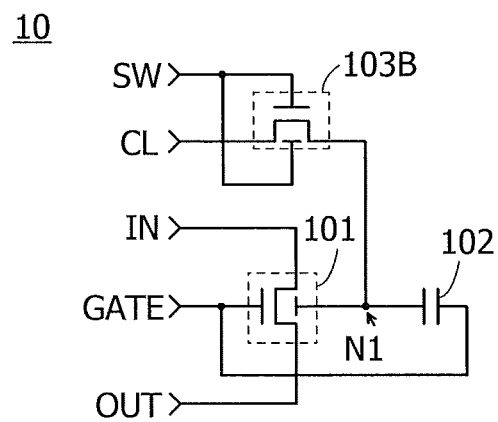

In the case where the switch 103 is an n-channel dual-gate transistor, a circuit diagram illustrated in FIG. 2B can be used. As illustrated in FIG. 2B, a transistor 103B may be provided instead of the switch 103, and the control signal SW may be supplied to both a front gate and a back gate of the transistor 103B. With the structure illustrated in FIG. 2B, on-state current can be increased and degradation due to a −GBT stress test can be suppressed in the transistor 103B as in the transistor 101.

In this specification and the like, any of a variety of switches can be used as a switch. That is, the switch has a function of determining whether current flows or not by being turning on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

In the case where a transistor is used as a switch, the polarity (conductivity type) of the transistor is not particularly limited to a certain type because it operates just as a switch. However, a transistor of polarity with smaller off-state current is preferably used when off-state current is to be suppressed. Examples of a transistor with smaller off-state current are a transistor provided with an LDD region, a transistor with a multi-gate structure, and the like.

In the case where the transistor 103A or the transistor 103B is used as the switch 103 as illustrated in FIG. 2A or 2B, a transistor with extremely small leakage current is preferably used in order that voltage change with charge transfer does not occur in the node N1 when the switch 103 is turned off.

Therefore, a transistor with extremely small leakage current between a source and a drain is used as the transistor 103A or 103B. Here, small leakage current means that leakage current at room temperature is 10 zA/μm or smaller. Since the leakage current is preferably as small as possible, the leakage current is preferably 1 zA/μm or smaller, more preferably 10 yA/μm or smaller, still more preferably 1 yA/μm or smaller. Note that voltage between a source and a drain in that case is, for example, approximately 0.1 V, 5 V, or 10 V. An example of a transistor with extremely small leakage current between a source and a drain is a transistor in which a channel formation region is formed in an oxide semiconductor.

Like the transistor 101, an oxide semiconductor may be included in a semiconductor layer of each of the transistor 103A and the transistor 103B each used as the switch 103.

As described above, in the structure of this embodiment, which is illustrated in FIG. 1A, the voltage VC which is control voltage for controlling the threshold voltage of the transistor 101 in a non-conduction state is supplied through the switch 103, and the node to which the back gate is connected is brought into an electrically floating state.

In addition, in the structure of this embodiment, which is illustrated in FIG. 1A, the back gate supplied with the voltage VC is made electrically floating in order to increase the current value when the transistor 101 is in a conduction state. Then, the control signal GATE is changed, whereby a potential based on change due to the control signal GATE is additionally supplied to the back gate of the transistor 101 using capacitive coupling through the capacitor 102.

Accordingly, a semiconductor device with a novel structure, which includes a transistor which achieves both control of the threshold voltage and an increase in the current value and has excellent reliability and electric characteristics can be provided.

Figure 1B:
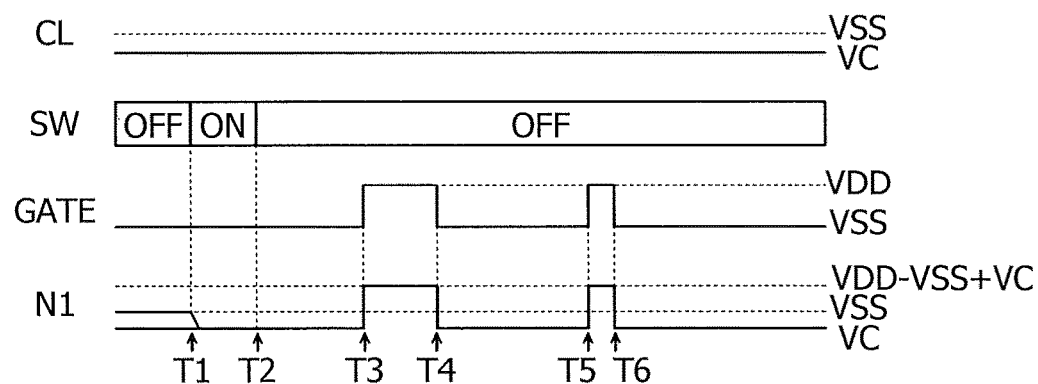

Next, an example of operation of the semiconductor device 10 is described with reference to FIG. 1B. FIG. 1B is a timing chart of the semiconductor device 10 in FIG. 1A.

The timing chart in FIG. 1B shows changes of potentials of the wiring CL, the control signal GATE, and the node N1, and on and off states of the switch 103 corresponding to the control signal SW.

In the timing chart in FIG. 1B, times T1 to T6 are used in order to explain operation of the semiconductor device 10.

In a period from the time T1 to the time T2, the switch 103 is turned on and the voltage VC is supplied to the node N1. Note that the potential of the voltage VC supplied to the wiring CL is preferably lower than the low power supply potential VSS in order that the threshold voltage of the transistor 101 is shifted in the positive direction. The voltage of the control signal GATE is an L level, which is the first voltage. The voltage of the node N1 changes from an undefined voltage to the voltage VC. At this time, in the transistor 101, the voltage with which the transistor 101 is brought into a non-conduction state is supplied to the front gate and the voltage with which the threshold voltage of the transistor 101 is shifted in the positive direction is supplied to the back gate. Therefore, leakage current through the transistor 101 due to change in the input signal IN in this period can be suppressed.

In a period from the time T2 to the time T3, the switch 103 is turned off, so that the voltage VC at the node N1 is held. The voltage of the control signal GATE is an L level, which is the first voltage. At this time, in the transistor 101, the voltage with which the transistor 101 is brought into a non-conduction state is supplied to the front gate and the voltage with which the threshold voltage of the transistor 101 is shifted in the positive direction is supplied to the back gate. Therefore, leakage current through the transistor 101 due to change in the input signal IN in this period can be suppressed. The same applies in a period from the time T4 to the time T5 and a period after the time T6.

In a period from the time T3 to the time T4, the switch 103 remains off, and the voltage of the control signal GATE is changed from an L level which is the first voltage to an H level which is the second voltage while the voltage VC supplied to the node N1 is held. Since the switch 103 is off at this time, the node N1 is in an electrically floating state. Therefore, voltage based on change in the voltage of the control signal GATE from the first voltage to the second voltage is added to the voltage VC of the node N1 by capacitive coupling through the capacitor 102. Specifically, the voltage of the node N1 is changed from the voltage VC to (VDD−VSS+VC) in which voltage (VDD−VSS) based on change in the voltage of the control signal GATE is added.

The voltage (VDD−VSS+VC) is supplied to the node N1, i.e., the back gate, and the voltage VDD is supplied to the front gate; thus, electric fields can be applied to the channel formation region of the transistor 101 from above and below. Therefore, the amount of carriers flowing through the semiconductor layer of the transistor 101 can be increased, leading to an increase in the field-effect mobility and on-state current of the transistor 101. Note that the same applies in a period from the time T5 to the time T6.

According to one embodiment of the present invention described above, a semiconductor device including a transistor which achieves both control of the threshold voltage and an increase in the current value and has excellent reliability and electric characteristics can be provided.

This embodiment can be implemented in appropriate combination with any of the other embodiments.

Embodiment 2

In this embodiment, a semiconductor device having a structure which is different from the structure of the semiconductor device 10 described in Embodiment 1 is described. Note that the same reference numerals denote the same parts as in Embodiment 1, and a detailed description is omitted.

Figure 3A:
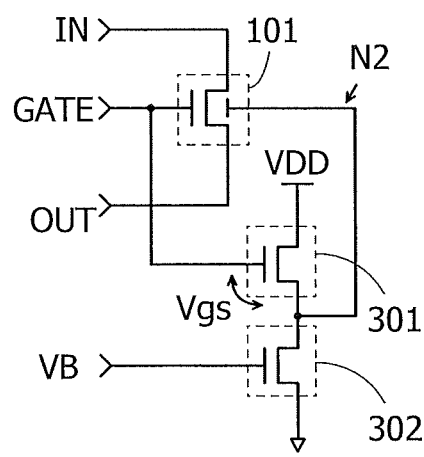
FIGS. 3A and 3B are views for describing a circuit of one embodiment of the present invention.

A semiconductor device 20 in FIG. 3A includes a transistor 101, a transistor 301, and a transistor 302.

The transistor 301 includes a gate connected to a wiring for supplying the control signal GATE, and a source and a drain one of which is connected to a wiring supplied with the high power supply potential VDD and the other of which is connected to the back gate of the transistor 101.

The transistor 302 includes a gate connected to a wiring for supplying a bias voltage VB, and a source and a drain one of which is connected to a wiring supplied with a fixed potential lower than the low power supply potential VSS and the other of which is connected to the back gate of the transistor 101 and the other of the source and the drain of the transistor 301. The transistor 302 can be replaced with a resistor, a constant current source, or the like.

In FIG. 3A, a node to which the back gate of the transistor 101, the other of the source and the drain of the transistor 301, and the other of the source and the drain of the transistor 302 are connected is a node N2.

The transistor 301 and the transistor 302 form a circuit functioning as a source follower. A signal output from the circuit has voltage lower than voltage of input signal by the voltage (Vgs) between the gate and the source of the transistor 301. Therefore, the voltage of the node N2 is changed in accordance with change in the control signal GATE.

In the structure illustrated in FIG. 3A, voltage (VSS−Vgs) is supplied to the back gate of the transistor 101 in a period during which the transistor 101 is in a non-conduction state, i.e., in a period during which the first voltage is supplied to the front gate of the transistor 101. Voltage (VDD−Vgs) in which voltage (VDD−VSS) based on change in the voltage of the front gate is added to the voltage (VSS−Vgs) is supplied to the back gate of the transistor 101 in a period during which the transistor 101 is in a conduction state, i.e., in a period during which the second voltage is supplied to the front gate of the transistor 101. Therefore, the voltage of the back gate of the transistor 101 can be changed in accordance with change in the control signal GATE.

The voltage (VSS−Vgs) for controlling the threshold voltage, which is supplied to the back gate of the transistor, may be adjusted by adjusting the bias voltage VB and changing Vgs. By adjusting Vgs; the threshold voltage of the transistor 101 can be shifted in the positive direction with the voltage (VSS−Vgs) like the voltage VC described in Embodiment 1. The transistor 101 becomes an enhancement transistor, i.e., a normally-off transistor. The voltage (VSS−Vgs) is continuously supplied to the node N2 in a period during which the first voltage is supplied to the front gate of the transistor 101.

The voltage (VDD−Vgs) supplied to the back gate of the transistor may be adjusted by adjusting the bias voltage VB and changing Vgs. In the case where an increase in the current value has higher priority than control of the threshold voltage, Vgs may be made small by adjusting the bias voltage VB. In the case where control of the threshold voltage has higher priority, Vgs may be made large by adjusting the bias voltage VB.

The bias voltage VB may be changed according to change in the control signal GATE. In this case, operation may be performed in the following manner in the case where the control signal GATE is at the first voltage, Vgs is increased by increasing the bias voltage VB; in the case where the control signal GATE is at the second voltage, Vgs is decreased by decreasing the bias voltage VB.

As described above, similarly to the structure in Embodiment 1, with the structure of this embodiment, a semiconductor device with a novel structure, which includes a transistor which achieves both control of the threshold voltage and an increase in the current value and has excellent reliability and electric characteristics can be provided. Particularly in this embodiment, only one voltage, i.e., the bias voltage VB, is supplied instead of supplying a signal such as the control signal SW and voltage such as the voltage VC supplied to the wiring CL. This is preferable because the number of wirings can be reduced and another control signal does not need to be generated, as compared to the structure in Embodiment 1.

Figure 3B:
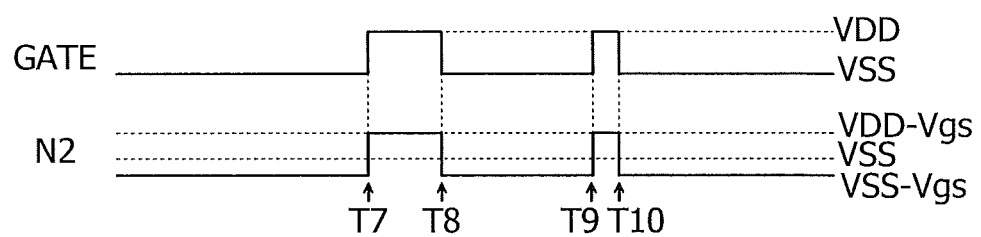

Next, an example of operation of the semiconductor device 20 is described with reference to FIG. 3B. FIG. 3B is a timing chart of the semiconductor device 20 in FIG. 3A.

The timing chart of FIG. 3B shows changes of potentials of the control signal GATE and the node N2.

In the timing chart in FIG. 3B, times T7 to T10 are used in order to explain operation of the semiconductor device 20.

In a period before the time T7, the voltage of the control signal GATE is an L level, which is the first voltage. At this time, in the transistor 101, voltage with which the transistor 101 is brought into a non-conduction state is supplied to the front gate and voltage (VSS−Vgs) for controlling the threshold voltage is supplied to the back gate. Therefore, leakage current through the transistor 101 due to change in the input signal IN in this period can be suppressed. The same applies in a period from the time T8 to the time T9 and a period after the time T10.

In a period from the time T7 to the time T8, the voltage of the control signal GATE is an H level, which is the second voltage. At this time, voltage based on change in the control signal GATE from the first voltage to the second voltage is added to the voltage (VSS−Vgs) of the node N2. Specifically, the voltage of the node N2 is changed from the voltage (VSS−Vgs) to the voltage (VDD−Vgs) in which voltage (VDD−VSS) based on change in the voltage of the control signal GATE is added.

The voltage (VDD−Vgs) is supplied to the node N2, i.e., the back gate and the voltage VDD is supplied to the front gate; thus, electric fields can be applied to the channel formation region of the transistor 101 from above and below. Therefore, the amount of carriers flowing through the semiconductor layer of the transistor 101 can be increased, leading to an increase in the field-effect mobility and on-state current of the transistor 101. Note that the same applies in a period from the time T9 to the time T10.

Although each of the transistor 301 and the transistor 302 is described as being an n-channel transistor, each of the transistor 301 and the transistor 302 may be a p-channel transistor. A transistor manufactured through the same process as the transistor 101 can be used for each of the transistors 301 and 302.

As described above, with the structure of this embodiment, a semiconductor device which includes a transistor which achieves both control of the threshold voltage and an increase in the current value and has excellent reliability and electric characteristics can be provided. Particularly in this embodiment, only one voltage, i.e., the bias voltage VB, is supplied instead of supplying voltage such as the voltage VC and a signal such as the control signal SW. This is preferable because the number of wirings can be reduced and another control signal does not need to be generated, as compared to the structure in Embodiment 1.

The structure described above in this embodiment can be combined as appropriate with any of the structures described in the other embodiments.

Embodiment 3

In this embodiment, a display device including a semiconductor device described in Embodiment 1 or 2 is described. In particular, a structure example of a display device including the semiconductor device 10 described in Embodiment 1 is described in this embodiment.

Figure 4A:
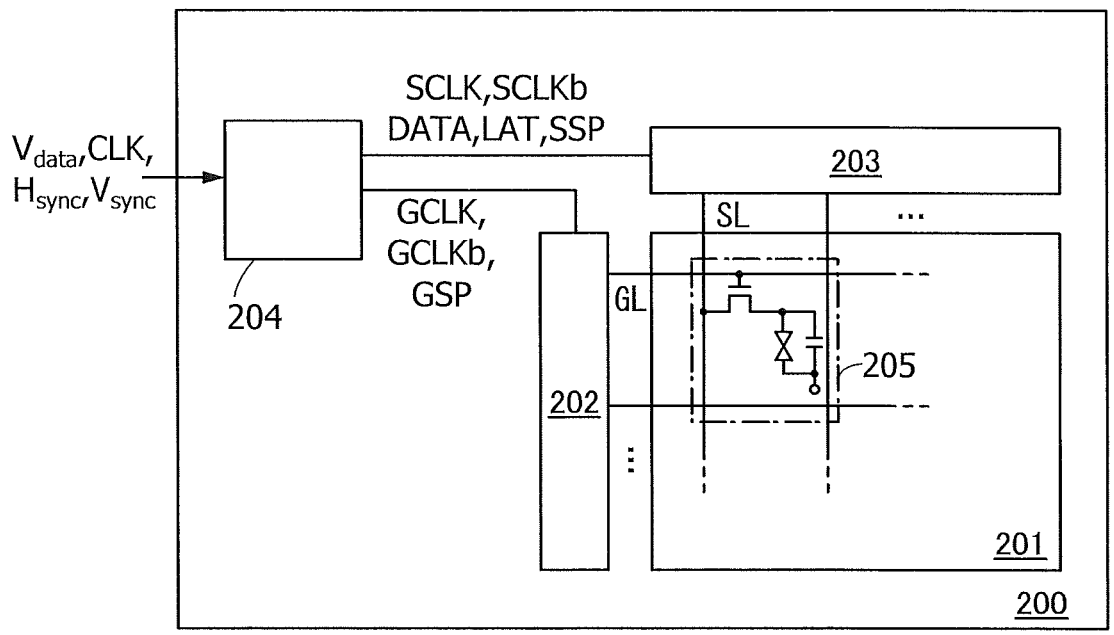
FIGS. 4A to 4D are views each for describing a circuit of one embodiment of the present invention.

FIG. 4A is a block diagram illustrating a structure example of a liquid crystal display device. A display device 200 includes, for example, a pixel portion 201, a gate line driver circuit 202, a source line driver circuit 203, and a control circuit 204.

The pixel portion 201 includes a plurality of pixels 205 provided in a matrix. Each of the pixels 205 is supplied with a gate signal and an image signal from a gate line GL connected to the gate line driver circuit 202 and a source line SL connected to the source line driver circuit 203, respectively; thus, display is controlled.

Figure 4B:
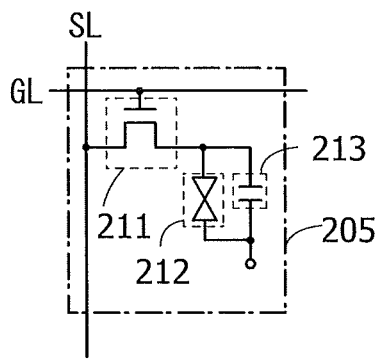

As illustrated in FIG. 4B, the pixel 205 includes a transistor 211, a liquid crystal element 212, and a capacitor 213. On and off states of the transistor 211 functioning as a switch is controlled by the gate signal supplied to the gate line. The image signal to be supplied to the pixel 205 is supplied to the source line SL. The potential of the image signal is held in the capacitor 213 through the transistor 211, and then applied to the liquid crystal element 212.

Figure 4C:
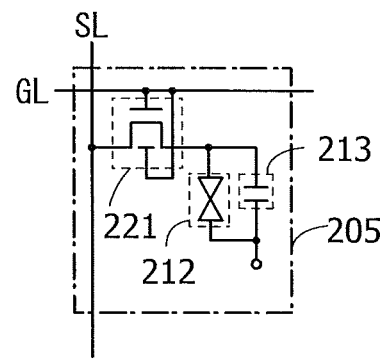

As a structure example of the pixel, a dual-gate transistor 221 can be used instead of the transistor 211, as illustrated in FIG. 4C. With such a structure, the amount of current flowing through the transistor 221 can be increased; thus, the size of the transistor can be reduced and the aperture ratio can be improved.

Although a liquid crystal display device is described as an example of a display device including the semiconductor device 10 in this embodiment, the semiconductor device 10 can also be included in a display device including an EL element or a display device including an electrophoretic element.

Figure 4D:
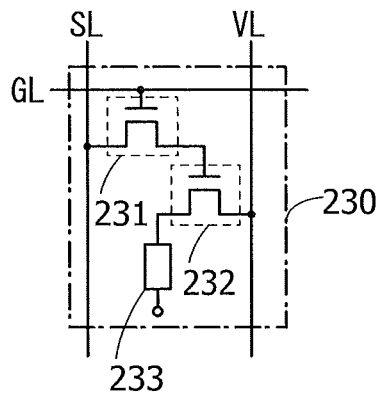

FIG. 4D illustrates a structure of a pixel including an EL element as an example. FIG. 4D illustrates a structure example of a pixel 230 including a transistor 231, a transistor 232, and an EL element 233. The EL element 233 emits light when current flows thereinto from a current supply line VL through the transistor 232.

The gate line driver circuit 202 has a function of generating a gate signal supplied to the pixels 205. The gate signal is supplied to each pixel through the gate line GL. Examples of a control signal for making the gate line driver circuit 202 operate include a gate line start pulse GSP, a gate line clock signal GCLK, and a gate line inverted clock signal GCLKb. The control signal is supplied to a shift register included in the gate line driver circuit 202.

The source line driver circuit 203 has a function of outputting an image signal, which is to be supplied to the pixels 205, to the source line SL at the timing at which the gate signal is supplied. The image signal is supplied to each pixel through the source line SL. Examples of a control signal for making the source line driver circuit 203 operate include a source line start pulse SSP, a source line clock signal SCLK, and a source line inverted clock signal SCLKb. The control signal is supplied to a shift register included in the source line driver circuit 203. A latch pulse LAT, an image signal DATA, and the like are input to the source line driver circuit 203.

A transistor formed through the same process as the transistor included in the pixel portion 201 can be used for each of the shift registers included in the gate line driver circuit 202 and the source line driver circuit 203. Note that only one of the gate line driver circuit 202 and the source line driver circuit 203 may include a transistor formed through the same process as the transistor included in the pixel portion 201.

The control circuit 204 has a function of generating various signals supplied to the gate line driver circuit 202 and the source line driver circuit 203. A video signal $V_{data}$, a reference clock signal CLK, a horizontal synchronization signal $H_{sync}$, and a vertical synchronization signal $V_{sync}$ are input to the control circuit 204 from the outside, and various signals are generated therein.

The semiconductor device described in Embodiment 1 or 2 can be used in the shift registers included in the gate line driver circuit 202 and the source line driver circuit 203, in particular, used instead of a transistor functioning as a buffer included in a pulse output circuit of the shift register. In the shift register, the current value in a conduction state is preferably increased in order to obtain a display device with a narrow frame. In addition, the threshold voltage of each transistor is preferably controlled in order to reduce malfunction of the pixel portion 201. With the semiconductor device described in Embodiment 1 or 2, a display device including a semiconductor device which achieves both an increase in the current value and control of the threshold voltage can be provided. Thus, a display device with a narrow frame, in which malfunction of a pixel portion due to a normally-on transistor is reduced, can be provided.

The above-mentioned shift register including the semiconductor device 10 is described below. As an example, FIGS. 5A and 5B are a block diagram and a circuit diagram of the shift register included in the gate line driver circuit 202.

Figure 5A:
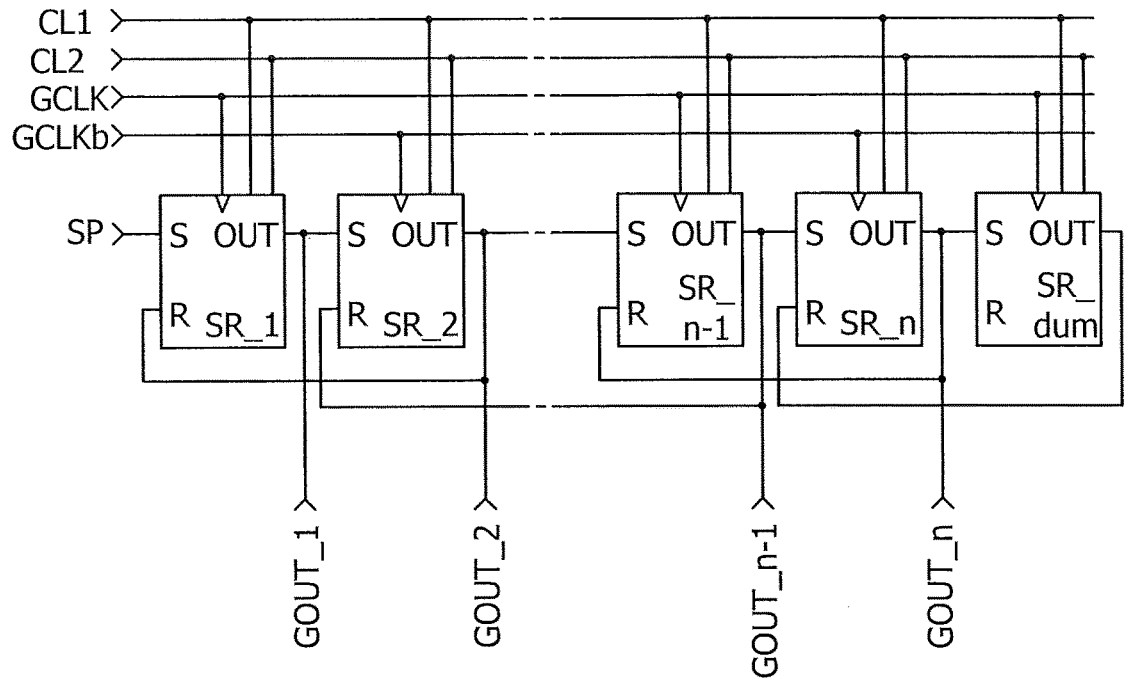
FIGS. 5A and 5B are views for describing a circuit and operation of one embodiment of the present invention.

FIG. 5A is a block diagram for describing an example of a shift register. The shift register illustrated in FIG. 5A includes n-stage (n is 4 or greater) pulse output circuits SR_1 to SR_n. Moreover, the shift register illustrated in FIG. 5A includes a pulse output circuit SR_dum in a dummy stage, in addition to the n-stage pulse output circuits. In FIG. 5A, a gate line start pulse (GSP) is input as a set signal (S) to the pulse output circuit SR_1. To each of the pulse output circuit SR_2 and the following pulse output circuits, an output signal (OUT) of the pulse output circuit in the previous stage is input as a set signal (S). To each of the pulse output circuits SR_1 to SR_n, an output signal (OUT) of the pulse output circuit in the subsequent stage is input as a reset signal (R). A gate line clock signal (GCLK) is input to the pulse output circuits in the odd-numbered stages. A gate line inverted clock signal (CLKBb) is input to the pulse output circuits in the even-numbered stages. In the shift register illustrated in FIG. 5A, output signals of the pulse output circuits SR_1 to SR_n are output as gate signals to corresponding gate lines GOUT_1 to GOUT_n of first to n-th rows.

Figure 5B:
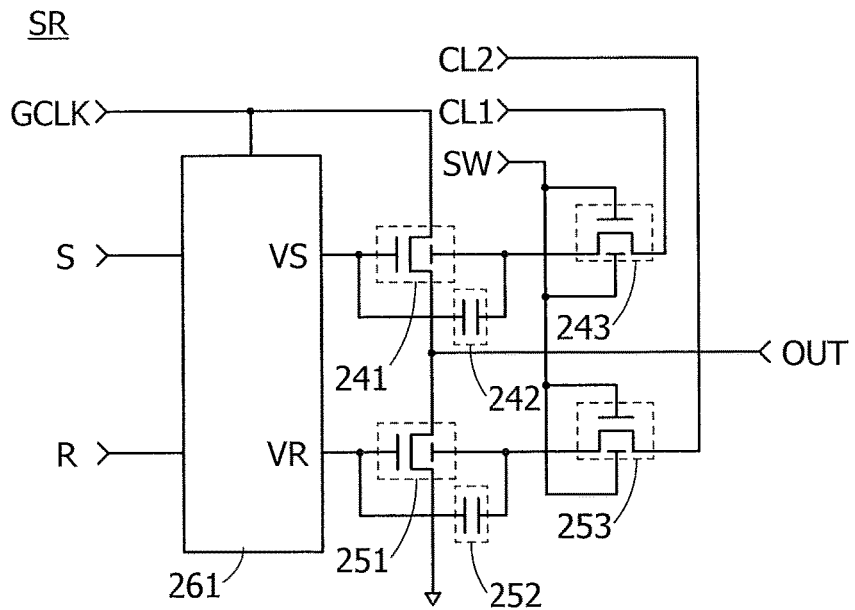

FIG. 5B is a circuit diagram of the pulse output circuit SR in one stage, illustrated in FIG. 5A. The pulse output circuit SR includes a transistor 241 and a transistor 251 each functioning as a buffer.

The control signal GATE for controlling conduction states of the transistor 241 and the transistor 251 is controlled by a circuit 261 supplied with the set signal (S) and the reset signal (R). For example, when a pulse signal is supplied as the set signal (S) to the circuit 261, a potential supplied to a front gate (node VS) of the transistor 241 is increased and a potential supplied to a front gate (node VR) of the transistor 251 is decreased. Furthermore, when a pulse signal is supplied as the reset signal (R) to the circuit 261, the potential supplied to the front gate (node VR) of the transistor 251 is increased and the potential supplied to the front gate (node VS) of the transistor 241 is decreased.

A potential which is supplied to one of a source and a drain of the transistor 241 varies in accordance with the gate line clock signal GCLK corresponding to the input signal IN. Although not provided in the circuit in FIG. 5B, a capacitor may be provided between a gate of the transistor 241 and the other of the source and the drain of the transistor 241.

One of a source and a drain of the transistor 251 is supplied with a ground potential or a low power supply potential VS S, and the other thereof is connected to the other of the source and the drain of the transistor 241. Note that change in a potential of a wiring connecting the other of the source and the drain of the transistor 241 and the other of the source and the drain of the transistor 251 is output as the output signal OUT.

The transistor 241 and the transistor 251 illustrated in FIG. 5B each correspond to the transistor 101 included in the semiconductor device 10 described in Embodiment 1. A capacitor 242 is provided between the front gate and a back gate of the transistor 241. A transistor 243 functioning as a switch is provided between a wiring CL1 for supplying voltage VC1 and the back gate of the transistor 241. A capacitor 252 is provided between the front gate and a back gate of the transistor 251. A transistor 253 functioning as a switch is provided between a wiring CL2 for supplying voltage VC2 and the back gate of the transistor 251. A control signal SW for controlling on and off states is supplied to each of the transistor 243 and the transistor 253. Although the transistor 243 and the transistor 253 are each a dual-gate transistor here as an example, a transistor having another structure may alternatively be used.

The capacitor 242 and the capacitor 252 each correspond to the capacitor 102 included in the semiconductor device 10 described in Embodiment 1. The transistor 243 and the transistor 253 each correspond to the switch 103 included in the semiconductor device 10 described in Embodiment 1. The voltage VC1 and the voltage VC2 each correspond to the voltage VC described in Embodiment 1. The control signal SW in this embodiment corresponds to the control signal SW described in Embodiment 1.

Accordingly, the transistor 241 and the transistor 251 in FIG. 5B can each be a transistor which achieves both control of the threshold voltage and an increase in the current value and has excellent reliability and electric characteristics. Thus, a display device with a narrowed frame, in which malfunction of a pixel portion due to a normally-on transistor is reduced, can be provided.

Although an EL element and a liquid crystal element are used as a display element here, one embodiment of the present invention is not limited thereto.

For example, in this specification and the like, a display element, a display device which is a device including a display element, a light-emitting element, and a light-emitting device which is a device including a light-emitting element can employ various modes or can include various elements. Examples of a display element; a display device, a light-emitting element, and a light-emitting device include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter; a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, and a carbon nanotube, which are display media whose contrast, luminance, reflectivity, transmittance, or the like is changed by electromagnetic action. Examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

The structure described above in this embodiment can be combined as appropriate with any of the structures described in the other embodiments.

Embodiment 4

In this embodiment, structures in a top view and a cross-sectional view illustrating a transistor included in a semiconductor device of one embodiment of the disclosed invention will be described with reference to drawings. Note that an oxide semiconductor is used for a semiconductor layer included in the transistor, and a structure including, as the switch 103, the transistor 103B illustrated in FIG. 2B is described.

Figure 6:
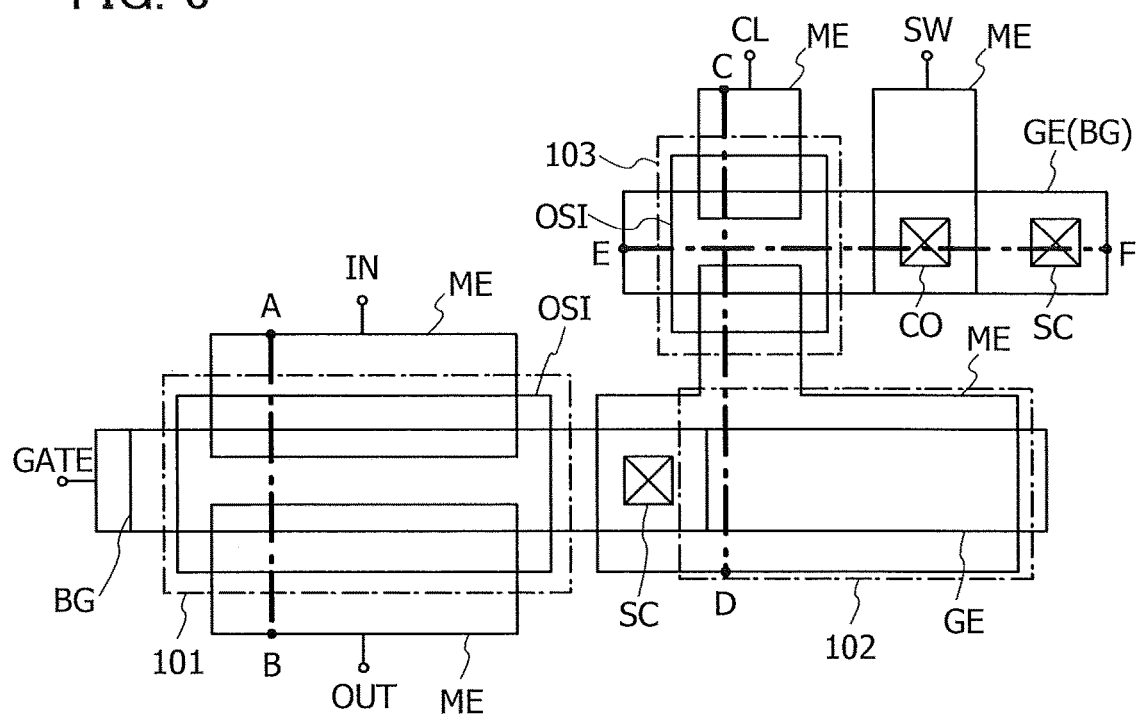
FIG. 6 is a top view of one embodiment of the present invention.
Figure 7A:
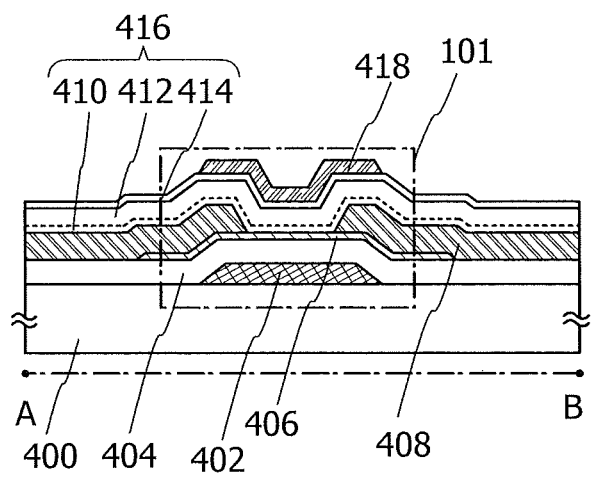
FIGS. 7A and 7B are each a cross-sectional view of one embodiment of the present invention.
Figure 7B:
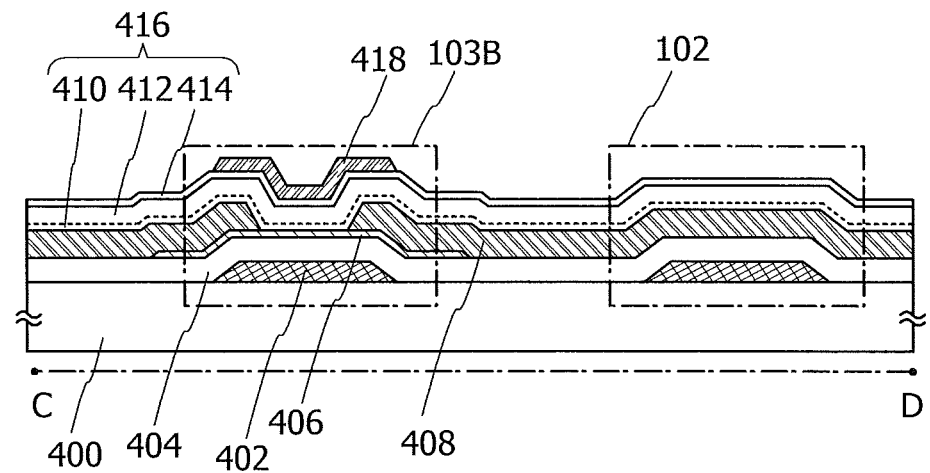
Figure 8:
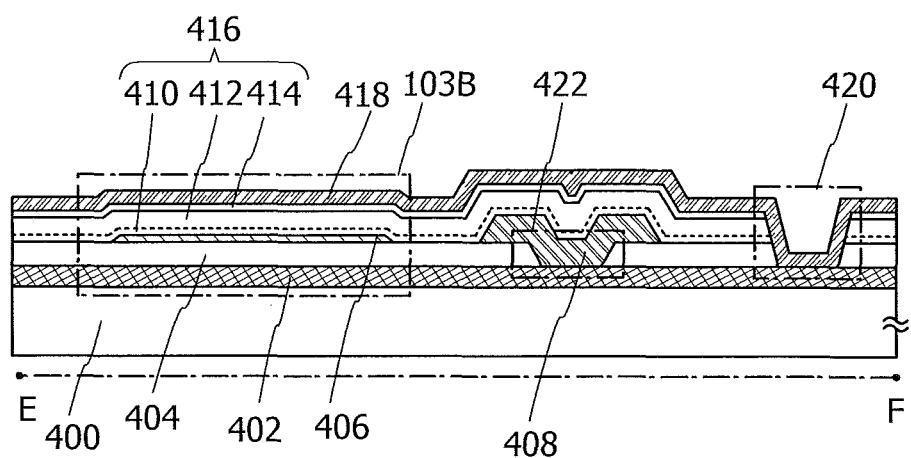
FIG. 8 is a cross-sectional view of one embodiment of the present invention.

FIG. 6, FIGS. 7A and 7B, and FIG. 8 are a top view and cross-sectional views of the transistor 101, the capacitor 102, and the transistor 103B included in the semiconductor device illustrated in FIG. 2B. FIG. 6 is a top view of the transistor 101, the capacitor 102, and the transistor 103B. FIG. 7A is a cross-sectional view taken along dashed-dotted line A-B in FIG. 6. FIG. 7B is a cross-sectional view taken along dashed-dotted line C-D in FIG. 6. FIG. 8 is a cross-sectional view taken along dashed-dotted line E-F in FIG. 6. A substrate and insulating layers such as a gate insulating layer and an interlayer insulating layer are omitted in FIG. 6 for simplicity.

In the top view of FIG. 6, a conductive layer where a first gate is formed is denoted by a symbol 'GE'; a semiconductor layer including an oxide semiconductor is denoted by a symbol 'OSI'; a conductive layer where a source and a drain are formed is denoted by a symbol 'ME'; an opening portion for connecting the conductive layer where the first gate is formed and the conductive layer where the source and the drain are provided is denoted by a symbol 'CO'; a conductive layer where a second gate is formed is denoted by a symbol 'BG'; and an opening portion for connecting the conductive layer where the first gate is formed and the conductive layer where the second gate is formed is denoted by a symbol 'SC'. The signals and input voltages described in Embodiment 1 are also shown in FIG. 6.

The transistor 101 and the transistor 103B in FIGS. 7A and 7B and FIG. 8 are each a dual-gate transistor.

Each of the transistor 101 and the transistor 103B includes a conductive layer 402 which is provided over a substrate 400 and functions as a first gate electrode, an insulating layer 404 which is provided over the substrate 400 and the conductive layer 402 and functions as a gate insulating film, a semiconductor layer 406 which overlaps with the conductive layer 402 with the insulating layer 404 provided therebetween, and a conductive layer 408 which is in contact with the semiconductor layer 406 and functions as a source electrode or a drain electrode. An insulating layer 416 which includes an oxide insulating layer 410, an oxide insulating layer 412, and a nitride insulating layer 414 and functions as a gate insulating film is provided over the insulating layer 404, the semiconductor layer 406, and the conductive layer 408. A conductive layer 418 functioning as a second gate electrode is provided over the insulating layer 416.

The capacitor 102 includes the conductive layer 402 which is provided over the substrate 400 and functions as one electrode of the capacitor 102, the insulating layer 404 formed over the substrate 400 and the conductive layer 402, and the semiconductor layer 406 which overlaps with the conductive layer 402 with the insulating layer 404 provided therebetween and functions as the other electrode of the capacitor 102.

The conductive layer 418 is connected to the conductive layer 402 in an opening portion 420 provided in the insulating layer 404 and the insulating layer 416. The conductive layer 408 is connected to the conductive layer 402 in an opening portion 422 provided in the insulating layer 404. Note that the conductive layer 418 functions as a pixel electrode.

Detailed structures of the transistor 101, the capacitor 102, and the transistor 103B are described below.

There is no particular limitation on the property of a material and the like of the substrate 400 as long as the material has heat resistance enough to withstand at least heat treatment to be performed later. For example, a glass substrate, a ceramic substrate, a quartz substrate, a sapphire substrate, or the like may be used as the substrate 400. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 400. Furthermore, any of these substrates further provided with a semiconductor element may be used as the substrate 400. In the case where a glass substrate is used as the substrate 400, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

The conductive layer 402 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. In addition, the conductive layer 402 can have a single-layer structure or a stacked structure having two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The insulating layer 404 may be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like.

The insulating layer 404 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The semiconductor layer 406 is formed using a metal oxide containing at least In or Zn; as a typical example, an In—Ga oxide, an In—Zn oxide, or an In-M-Zn oxide (M is Al, Ga, Y, Zr, La, Ce, or Nd) can be given.

When the semiconductor layer 406 contains an In-M-Zn oxide, in the case where the total atomic percentage of In and M is assumed to be 100 at. %, the proportion of In and the proportion of M are preferably as follows: the atomic percentage of In is higher than or equal to 25 at. % and the atomic percentage of M is lower than 75 at. %; more preferably, the atomic percentage of In is higher than or equal to 34 at. % and the atomic percentage of M is lower than 66 at. %.

The energy gap of the semiconductor layer 406 is 2 eV or more, preferably 2.5 eV or more, further preferably 3 eV or more. With the use of an oxide semiconductor having such a wide energy gap, the off-state current of the transistors 101 and 103B can be reduced.

The thickness of the semiconductor layer 406 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 406 contains an In-M-Zn oxide (M is Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the formed semiconductor layer 406 varies from the above atomic ratio of metal elements of the sputtering target within a range of ±40% as an error.

An oxide semiconductor film with low carrier density is used as the semiconductor layer 406. For example, an oxide semiconductor film whose carrier density is $1\times10^{17}/cm^3$ or lower, preferably $1\times10^{15}/cm^3$ or lower, more preferably $1\times10^{13}/cm^3$ or lower, much more preferably $1\times10^{11}/cm^3$ or lower is used as the semiconductor layer 406.

Note that if an oxide semiconductor film forming the semiconductor layer 406 contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, and more preferably less than or equal to $1\times10^{-24}$ A; or at 85° C., less than or equal to $1\times10^{-15}$ A, preferably less than or equal to $1\times10^{-18}$ A, more preferably less than or equal to $1\times10^{-21}$ A. An off state of a transistor refers to a state where a gate voltage is much lower than the threshold voltage in an n-channel transistor. Specifically, when the gate voltage is lower than the threshold voltage by 1 V or more, 2 V or more, or 3 V or more, the transistor is off.

In addition, the semiconductor layer 406 preferably includes a c-axis aligned crystalline oxide semiconductor (CAAC-OS) described later. The CAAC-OS structure has lower density of defect states than a polycrystalline structure, a microcrystalline structure described later, and an amorphous structure.

The semiconductor layer 406 which is to be formed may include a non-single-crystal, for example. The non-single-crystal state is, for example, structured by at least one of c-axis aligned crystal (CAAC), polycrystal, microcrystal, and an amorphous part.

The conductive layer 408 is formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating layer 416 includes the oxide insulating layer 410 in contact with the semiconductor layer 406, the oxide insulating layer 412 in contact with the oxide insulating layer 410, and the nitride insulating layer 414 in contact with the oxide insulating layer 412. The insulating layer 416 preferably includes at least an oxide insulating layer which contains oxygen at a higher proportion than the stoichiometric composition. Here, an oxide insulating layer through which oxygen passes is formed as the oxide insulating layer 410. An oxide insulating film which contains oxygen at a higher proportion than the stoichiometric composition is formed as the oxide insulating layer 412. A nitride insulating film which blocks hydrogen and oxygen is formed as the nitride insulating layer 414. Although the insulating layer 416 has a three-layer structure here, the insulating layer 416 can have a single-layer structure, a two-layer structure, or a layered structure including four or more layers as appropriate. Note that in these cases, at least an oxide insulating film which contains oxygen at a higher proportion than the stoichiometric composition is preferably included.

The oxide insulating layer 410 is an oxide insulating layer through which oxygen passes. Thus, oxygen released from the oxide insulating layer 412 provided over the oxide insulating layer 410 can be moved to the semiconductor layer 406 through the oxide insulating layer 410. The oxide insulating layer 410 also functions as a film that relieves damage to the semiconductor layer 406 at the time of forming the oxide insulating layer 412.

As the oxide insulating layer 410, a silicon oxide film, a silicon oxynitride film, or the like having a thickness greater than or equal to 5 nm and less than or equal to 150 nm, preferably greater than or equal to 5 nm and less than or equal to 50 nm can be used. Note that in this specification, "silicon oxynitride film" refers to a film that contains oxygen at a higher proportion than nitrogen, and "silicon nitride oxide film" refers to a film that contains nitrogen at a higher proportion than oxygen.

Further, it is preferable that the number of defects in the oxide insulating layer 410 be small and typically, the spin density of a signal that appears at g=2.001 due to a dangling bond of silicon be lower than or equal to $3\times10^{17}$ spins/cm$^3$ by electron spin resonance (ESR) measurement. This is because, if the density of defects in the oxide insulating layer 410 is high, oxygen is bonded to the defects and the amount of oxygen that passes through the oxide insulating layer 410 is decreased.

Further, it is preferable that the amount of defects at the interface between the oxide insulating layer 410 and the semiconductor layer 406 be small, and typically, the spin density of a signal that appears at a g value (due to a defect in the semiconductor layer 406) of greater than or equal to 1.89 and less than or equal to 1.96 be lower than or equal to $1\times10^{17}$ spins/cm$^3$, more preferably lower than or equal to the lower limit of detection by ESR measurement.

The oxide insulating layer 410 is formed in contact with the oxide insulating layer 412. The oxide insulating layer 412 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in IDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like having a thickness greater than or equal to 30 nm and less than or equal to 500 nm, preferably greater than or equal to 50 nm and less than or equal to 400 nm can be used as the oxide insulating layer 412.

Further, it is preferable that the amount of defects in the oxide insulating layer 412 be small, typically, the spin density of a signal that appears at g=2.001 originating from a dangling bond of silicon be lower than $1.5\times10^{18}$ spins/cm$^3$, more preferably lower than or equal to $1\times10^{18}$ spins/cm$^3$ by ESR measurement. Note that the oxide insulating layer 412 is provided more apart from the semiconductor layer 406 than the oxide insulating layer 410 is; thus, the oxide insulating layer 412 may have higher defect density than the oxide insulating layer 410.

The nitride insulating layer 414 has an effect of blocking at least hydrogen and oxygen. Preferably, the nitride insulating layer 414 has an effect of blocking oxygen, hydrogen, water, an alkali metal, an alkaline earth metal, or the like. It is possible to prevent outward diffusion of oxygen from the semiconductor layer 406 and entry of hydrogen, water, and the like into the semiconductor layer 406 from the outside by providing the nitride insulating layer 414 as the insulating layer 416.

The nitride insulating layer 414 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

The conductive layer 418 is formed using a light-transmitting conductive film. The light-transmitting conductive film can be formed using indium tin oxide (hereinafter, referred to as ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide, or the like.

As described in Embodiment 1, with the structure of the semiconductor device described in this embodiment, a semiconductor device with a novel structure, which includes a transistor which achieves both control of the threshold voltage and an increase in the current value and has excellent reliability and electric characteristics can be provided.

This embodiment can be implemented in appropriate combination with any of the other embodiments.

Embodiment 5

This embodiment will explain CAAC-OS that can be used for a semiconductor layer including a channel formation region of the transistor with small off-state current described in the foregoing embodiments.

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear grain boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be foil led by reducing the density of defect states, for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electric characteristics and high reliability in some cases. Charges trapped by the trap states in the oxide semiconductor take a long time to be released and may behave like fixed charges. Thus, the transistor including the oxide semiconductor having a high density of trap states in the channel formation region has unstable electric characteristics in some cases.

A transistor including the highly purified intrinsic or substantially highly purified intrinsic CAAC-OS has a small variation in the electric characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly observed in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has periodic atomic order occasionally. Further, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than a diameter of a crystal part, a peak which shows alignment does not appear in some cases. Further, for example, a halo pattern is observed in some cases in an electron diffraction pattern of the nc-OS obtained by using an electron beam having a diameter larger than a diameter of a crystal part (e.g., a beam diameter of 20 nmϕ or more, or 50 nmϕ or more). For example, spots are observed in some cases in a nanobeam electron diffraction pattern of the nc-OS obtained by using an electron beam having a diameter smaller than or equal to a diameter of a crystal part (e.g., a beam diameter of 10 nmϕ or less, or 5 nmϕ or less). In a nanobeam electron diffraction pattern of the nc-OS, for example, regions with high luminance in a circular pattern are observed in some cases. In a nanobeam electron diffraction pattern of the nc-OS, for example, a plurality of spots are observed in the region in some cases.

Since the microscopic region in the nc-OS has periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be implemented in appropriate combination with any of the other embodiments.

Embodiment 6

In this embodiment, a display module using a semiconductor device of one embodiment of the present invention is described with reference to FIG. 11.

Figure 11:
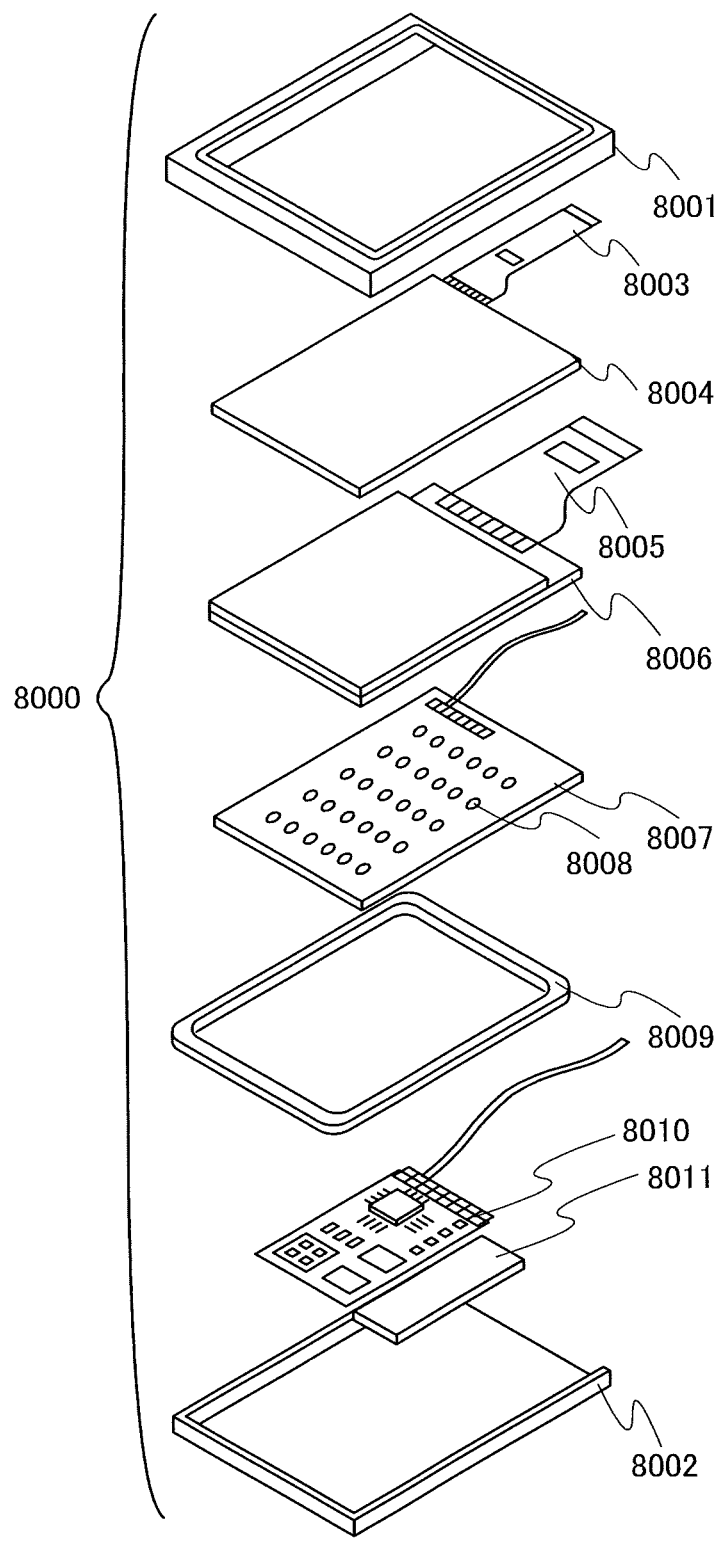
FIG. 11 illustrates a display module.

In a display module 8000 in FIG. 11, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be used overlapping with the display panel 8006. It is also possible to provide a touch panel function for a counter substrate (sealing substrate) of the display panel 8006. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

Embodiment 7

In this embodiment, application examples in which the semiconductor device described in any of the above embodiments is used in an electronic device will be described with reference to FIGS. 9A to 9C and FIGS. 10A to 10C. The semiconductor device described in any of the above embodiments includes a transistor which can achieve both control of the threshold voltage and an increase in the current value, and an electronic device including the semiconductor device can have excellent transistor characteristics and reliability.

Examples of electronic devices each in which the semiconductor device is used include computers, portable information terminals (including mobile phones, portable game machines, audio reproducing devices, and the like), electronic paper, television devices (also referred to as televisions or television receivers), and digital video cameras.

Figure 9A:
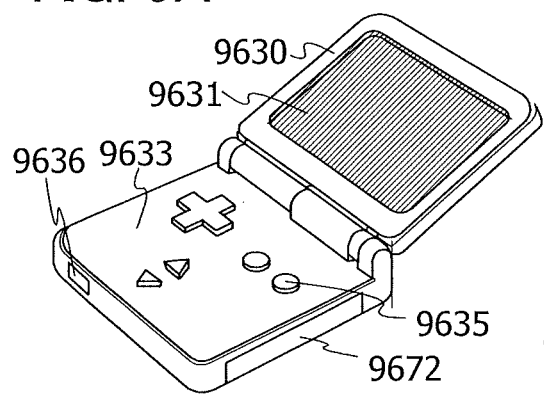
FIGS. 9A to 9C each illustrate an electronic device including a semiconductor device.

FIG. 9A illustrates a portable game machine including a housing 9630, a display portion 9631, speakers 9633, operation keys 9635, a connection terminal 9636, a recording medium reading portion 9672, and the like. The display portion 9631 includes the semiconductor device described in any of the above embodiments. Therefore, the portable game machine can include a display portion having excellent transistor characteristics and reliability.

Figure 9B:
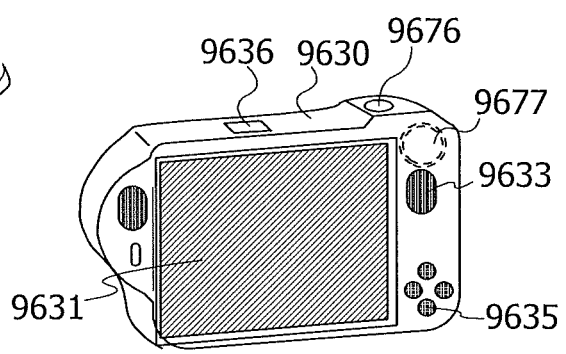

FIG. 9B illustrates a digital camera including the housing 9630, the display portion 9631, the speaker 9633, the operation keys 9635, the connection terminal 9636, a shutter button 9676, an image receiving portion 9677, and the like. The display portion 9631 includes the semiconductor device described in any of the above embodiments. Therefore, the digital camera can include a display portion having excellent transistor characteristics and reliability.

Figure 9C:
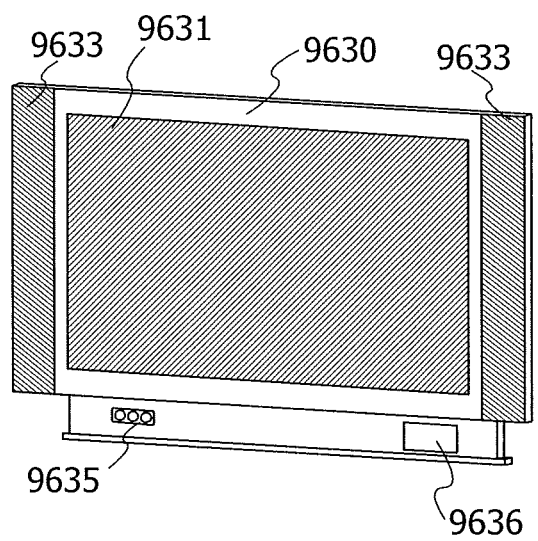

FIG. 9C illustrates a television receiver including the housing 9630, the display portion 9631, the speakers 9633, the operation keys 9635, the connection terminal 9636, and the like. The display portion 9631 includes the semiconductor device described in any of the above embodiments. Therefore, the television receiver can include a display portion having excellent transistor characteristics and reliability.

Figure 10A:
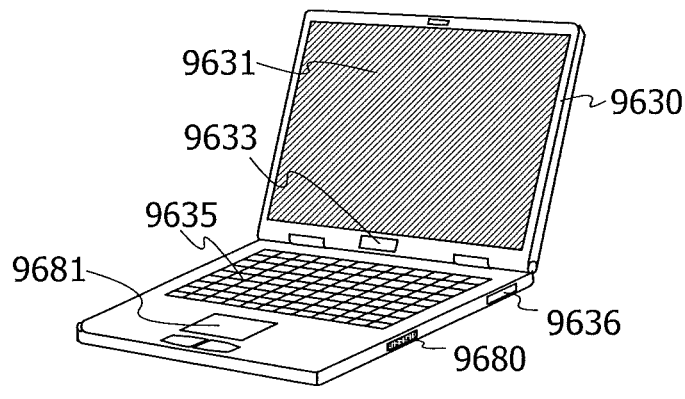
FIGS. 10A to 10C each illustrate an electronic device including a semiconductor device.

FIG. 10A illustrates a computer including the housing 9630, the display portion 9631, the speaker 9633, the operation keys 9635, the connection terminal 9636, a pointing device 9681, an external connecting port 9680, and the like. The display portion 9631 includes the semiconductor device described in any of the above embodiments. Therefore, the computer can include a display portion having excellent transistor characteristics and reliability.

Figure 10B:
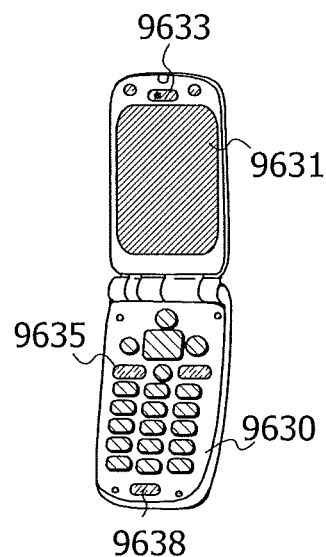

FIG. 10B illustrates a mobile phone including the housing 9630, the display portion 9631, the speaker 9633, the operation keys 9635, a microphone 9638, and the like. The display portion 9631 includes the semiconductor device described in any of the above embodiments. Therefore, the mobile phone can include a display portion having excellent transistor characteristics and reliability.

Figure 10C:
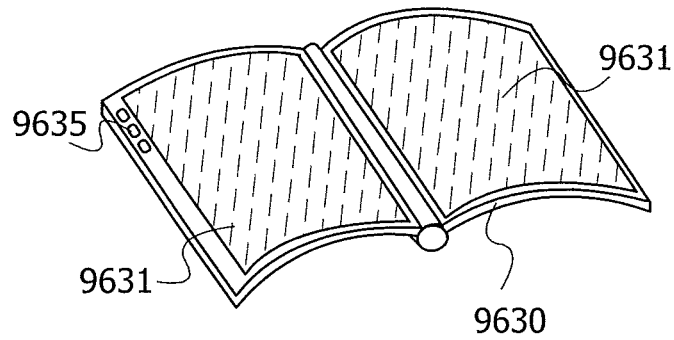

FIG. 10C is electronic paper (also referred to as an e-book reader) including the housing 9630, the display portions 9631, the operation keys 9635, and the like. The display portions 9631 each include the semiconductor device described in any of the above embodiments. Therefore, the electronic paper can include display portions having excellent transistor characteristics and reliability.

As described above, a display portion including the semiconductor device described in any of the above embodiments is provided for each of the electronic devices described in this embodiment. Therefore, the electronic devices can each include a display portion having excellent transistor characteristics and reliability.

This application is based on Japanese Patent Application serial no. 2013-183030 filed with Japan Patent Office on Sep. 4, 2013, the entire contents of which are hereby incorporated by reference.

What is claimed is:

1. A semiconductor device comprising:
a first transistor comprising a first gate and a second gate; and
a source follower circuit electrically connected to the first transistor, the source follower circuit comprising a second transistor and a third transistor,
wherein the second transistor and the third transistor are connected in series,
wherein the first gate is electrically connected to the second gate through the source follower circuit,
wherein a channel formation region of the first transistor is provided between the first gate and the second gate,
wherein in a first period during which a first voltage with which the first transistor is turned off is supplied to the first gate, a control voltage is supplied to the second gate,
wherein in a second period during which a second voltage with which the first transistor is turned on is supplied to the first gate, a third voltage is supplied to the second gate, and
wherein the second voltage is different from the third voltage.

2. The semiconductor device according to claim 1,
wherein an input terminal of the source follower circuit is electrically connected to the first gate, and
wherein an output terminal of the source follower circuit is electrically connected to the second gate.

3. The semiconductor device according to claim 1, wherein the first transistor comprises an oxide semiconductor in the channel formation region.

4. The semiconductor device according to claim 1, wherein the third voltage is higher than the control voltage.

5. The semiconductor device according to claim 1, wherein the third voltage changes in accordance with a change of a voltage of the first gate.

6. The semiconductor device according to claim 1, wherein the second gate is electrically floating in the second period.

7. A semiconductor device comprising:
a first transistor comprising a first gate and a second gate; and
a source follower circuit electrically connected to the first transistor, the source follower circuit comprising a second transistor and a third transistor,
wherein the second transistor and the third transistor are connected in series,
wherein the first gate is electrically connected to the second gate through the source follower circuit,
wherein the second gate is electrically connected to one of a source and a drain of the second transistor and one of a source and a drain of the third transistor,
wherein a channel formation region of the first transistor is provided between the first gate and the second gate,
wherein in a first period during which a first voltage with which the first transistor is turned off is supplied to the first gate, a control voltage is supplied to the second gate,
wherein in a second period during which a second voltage with which the first transistor is turned on is supplied to the first gate, a third voltage is supplied to the second gate, and
wherein the second voltage is different from the third voltage.

8. The semiconductor device according to claim 7,
wherein an input terminal of the source follower circuit is electrically connected to the first gate, and
wherein an output terminal of the source follower circuit is electrically connected to the second gate.

9. The semiconductor device according to claim 7, wherein the first transistor comprises an oxide semiconductor in the channel formation region.

10. The semiconductor device according to claim 7, wherein the third voltage is higher than the control voltage.

11. The semiconductor device according to claim 7, wherein the third voltage changes in accordance with a change of a voltage of the first gate.

12. The semiconductor device according to claim 7, wherein the second gate is electrically floating in the second period.

* * * * *